US005537116A

United States Patent [19]

Ishino et al.

[11] Patent Number: 5,537,116

[45] Date of Patent: Jul. 16, 1996

[54] ELECTROMAGNETIC WAVE ABSORBER

[75] Inventors: Ken Ishino; Yasuo Hashimoto; Hiroshi Kurihara; Yoshihito Hirai, all of Chiba, Japan

[73] Assignee: TDK Corporation, Tokyo, Japan

[21] Appl. No.: 420,488

[22] Filed: Apr. 12, 1995

[30] Foreign Application Priority Data

Apr. 15, 1994 [JP] Japan .................................. 6-101537

[51] Int. Cl.[6] ............................ H05K 9/00; H01Q 17/00

[52] U.S. Cl. .................................................................. 342/1

[58] Field of Search .................................. 342/1, 2, 3, 4; 523/137

[56] References Cited

U.S. PATENT DOCUMENTS

| | | | |
|---|---|---|---|
| 4,038,660 | 7/1977 | Connolly et al. . | |
| 5,214,432 | 5/1993 | Kasevich et al. | 324/3 |

FOREIGN PATENT DOCUMENTS

| | | |
|---|---|---|
| 0413580A1 | 2/1991 | European Pat. Off. . |
| 0499868A2 | 8/1992 | European Pat. Off. . |
| 0583557A1 | 2/1994 | European Pat. Off. . |
| 4008660A1 | 9/1991 | Germany . |
| 4101074A1 | 7/1992 | Germany . |

OTHER PUBLICATIONS

"Design of a Single Layer Broadband Microwave Absorber Using Cobalt–Substituted Barium Hexagonal Ferrite", GUPTA et al, *International Microwave Symposium Digest*, vol. 1, Jun. 1992, pp. 317–320.

Patent Abstracts of Japan, vol. 17, No. 476 (E–1424), Aug. 30, 1993 & JP–A–05 114 813.

*Primary Examiner*—Daniel T. Pihulic

*Attorney, Agent, or Firm*—Nikaido, Marmelstein, Murray & Oram

[57] ABSTRACT

An electromagnetic wave absorber is provided with a first dielectric material layer (90, 200, 220) having two surfaces, a wave reflection layer (91, 201, 221) laminated on the one surface of the first dielectric material layer, a first resistive layer (92, 202, 222) laminated on the other, opposite, surface of the first dielectric material layer (90, 200, 220), and a second dielectric material layer (95, 205, 225) disposed proximate to the first resistive layer (92, 202, 222) leaving an air space, (94, 204, 224) having a thickness sufficient to determine adjust absorption characteristics for polarized waves, between the second dielectric material layer and the first resistive layer.

5 Claims, 12 Drawing Sheets

*Fig.9*
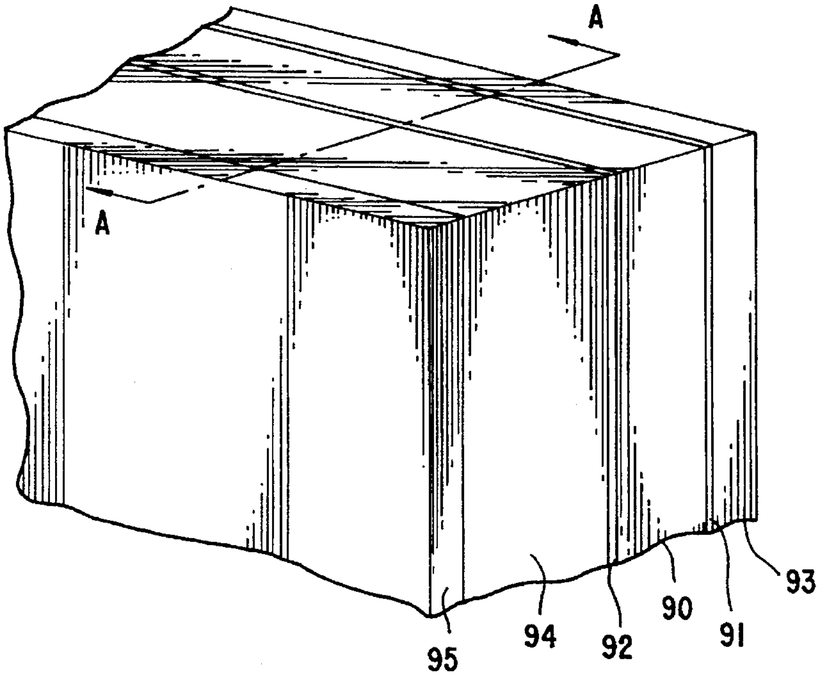
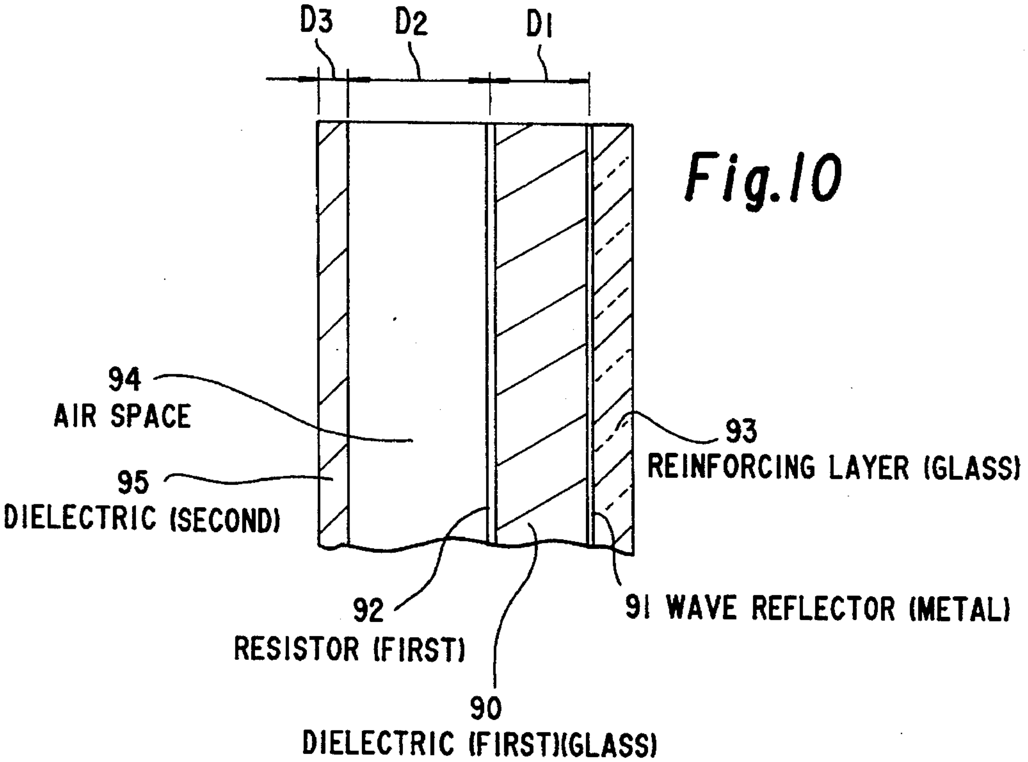
*Fig.10*

ELECTROMAGNETIC WAVE ABSORBER

FIELD OF THE INVENTION

The present invention relates to a thin type electromagnetic wave absorber capable of effectively suppressing reflections of incident waves including oblique incident waves. Particularly, the invention relates to an improved thin type electromagnetic wave absorber with a resistive layer positioned at a quarter wave-length distance from a wave reflector.

DESCRIPTION OF THE RELATED ART

Recently, as electromagnetic waves are more popularly utilized, problems caused by these waves, such as electromagnetic radiation troubles or electromagnetic radiation malfunctions, have been increased. To prevent such problems from occurring, it is advantageous to use thin type electromagnetic wave absorbers.

A typical and simple thin type electromagnetic wave absorber is constituted by a wave reflection layer 11 and a layer 10 laminated on the front surface of the layer 10 as shown in FIG. 1. The layer 10 is formed by mixing ferrite powder or carbon powder with rubber.

There is an another known thin type electromagnetic wave absorber with a resistive layer positioned at a quarter wave-length distance from a wave reflector, described in for example Japanese patent publication No.1990/58796 according to the applicant. This wave absorber is constituted by, as shown in FIG. 2, a wave reflection layer 21 laminated on the rear surface of a dielectric material layer 20 and a resistive layer 22 laminated on the front surface of the dielectric material layer 20. This dielectric layer 20 has a thickness of about $\lambda_g/4$ ($\lambda_g$ is a wave length of the waves within the dielectric material), and the resistive layer 22 has a surface resistance of about 377 Ω/□ in all directions.

As unnecessary reflected waves produced from structural objects are generally by not only perpendicular incident waves but also by oblique incident waves, it is necessary for the wave absorber to have good wave-absorption characteristics, even against oblique wave incidence. However, since the conventional thin type wave absorbers are not designed to absorb such oblique incident waves but are designed to absorb only perpendicular incident waves, they do not have enough reflection suppressing effect against the oblique wave incidence.

As shown in FIG. 3, if the wave incidence is perpendicular to the surface of a wave absorber 30, electric fields $E_i$ and magnetic fields $H_i$ of this incident electromagnetic wave are always kept in parallel with the surface of the absorber 30. However, if the wave incidence is oblique to the surface of the absorber 30, such parallel magnetic and electric fields to the surface will not generally occur. Namely, in case of the oblique wave incidence, there may be at least two kinds of linearly polarized waves, i.e. TE and TM waves. The TE wave has electric fields $E_i$ perpendicular to a plane of incidence 31 (a plane being perpendicular to the surface of the wave absorber and including wave incidence directions and wave reflection directions) as shown in FIG. 4, and the TM wave has magnetic fields $H_i$ perpendicular to the plane of incidence 31 as shown in FIG. 5. As there are various kinds of polarized waves such as these linearly polarized waves and circularly polarized wave, it is desired for the electromagnetic wave absorber to have reflection suppressing effect against any kinds of polarized waves, in particular against both TE and TM waves, without presenting polarization dependency.

It may be possible to provide an electromagnetic wave absorber having a certain wave-absorption performance against oblique wave incidence by repeatedly adjusting, by a cut and try method, the thickness, dielectric constant and permeability of the layer 10 of the conventional absorber shown in FIG. 1. However, it is quite difficult to design and realize a thin type electromagnetic wave absorber which can effectively absorb incident waves of any frequency and any incident angle without presenting polarization dependency.

It may also be possible to provide an electromagnetic wave absorber having a certain wave-absorption performance against oblique wave incidence by modifying the surface resistance of the resistive layer 22 to a value of other than 377 Ω /□, and by adjusting the thickness of the dielectric material layer 20 of the conventional absorber shown in FIG. 2. However, according to such absorber, although effective absorption performance can be obtained against one polarized wave, enough reflection suppressing effect cannot be expected against another linearly polarized waves and also against a circularly polarized wave.

SUMMARY OF THE INVENTION

It is therefore an object of the present invention to provide a thin type electromagnetic wave absorber which can effectively suppress any reflections caused by oblique wave incidence without presenting polarization dependency.

Another object of the present invention is to provide a thin type electromagnetic wave absorber which can be easily designed and manufactured.

When an electromagnetic wave is applied to an wave reflector, made of a material such as a metal, at an incident angle of θ, a standing-wave will be produced in front of the wave reflector. Therefore, an input impedance of the reflector, as seen from the wave incidence side, represents alternations of zero and infinity along the normal line of the reflector. An input impedance $Z_{in}$ at a position apart from the reflector surface by a certain distance $d_0$ will become infinity without depending upon polarizations of the wave, as shown in FIG. 6a. This distance $d_0$ is given as;

$$d_0 = \lambda/4\sqrt{1 - \sin^2\theta}$$

wherein λ is a wave-length of the incident wave.

If a resistive layer with a surface resistance of $R_s$ is arranged at the position of $d_0$, the input impedance $Z_{in}$ at that position, which takes into consideration this resistive layer, becomes equivalent to an impedance resulting from a parallel connection with respect to the surface resistance $R_s$ and the infinite impedance, namely $Z_{in}=R_s$, as shown in FIG. 6b. Thus, a reflection coefficient S and a normalized input impedance $Z_{in}$ in this case are represented depending upon the respective polarized waves as follows;

for TE wave, $$S=(R_s-Z_0/\cos\theta)/(R_s+Z_0/\cos\theta)$$

$$Z_{in}=(R_s/Z_0)\cdot\cos\theta$$

for TM wave, $$S=(R_s-Z_0\cdot\cos\theta)/(R_s+Z_0\cdot\cos\theta)$$

$$Z_{in}=(R_s/Z_0)/\cos\theta$$

wherein $Z_0$ is a characteristic impedance in the free space ($Z_0=120\ \pi\Omega$).

Accordingly, the reflection coefficient S can be adjusted to zero if the surface resistance $R_s$ of the resistive layer is determined to be $R_s=Z_0/\cos\theta$ for TE wave and if the surface resistance $R_s$ of the resistive layer is determined to be $R_s=Z_0\cdot\cos\theta$ for TM wave.

In the case where the space between the resistive layer and the wave reflector is filled with a dielectric material having a relative dielectric constant represented by $\epsilon_r$, the thickness d of this dielectric material layer will be adjusted as;

$$d=\lambda/4\sqrt{\epsilon_r-\sin^2\theta}\ .$$

If it is not necessary to control the reflection coefficient to zero, but if it is enough to control it to a value less than a predetermined constant value other than zero, the surface resistance of the resistive layer can be determined to be a value somewhat different from the value calculated by the aforementioned expression. For example, in order to control the reflection coefficient S to less than 0.1 at the oblique incident angle of θ=60°, the surface resistance $R_s$ for TE wave will be adjusted to $R_s$=617 to 922 Ω/□ and the surface resistance $R_s$ for TM wave will be adjusted to $R_s$=154 to 230 Ω/□.

FIG. 7 shows reflection attenuation versus frequency characteristics, for TE and TM waves, of a wave absorber in which the resistive layer with a surface resistance of 950 Ω/□, is positioned at a distance $d_0$ apart from the waves reflector so as to absorb TE wave with an oblique incident angle of 66°, and FIG. 8 shows reflection attenuation versus frequency characteristics, for TE and TM waves, of a wave absorber in which the resistive layer, with the surface resistance of 150 Ω/□ is positioned at a distance $d_0$ apart from the waves reflector so as to absorb TM wave with an oblique incident angle of 66°. As will be apparent from these figures, a wave absorber designed to absorb TE wave has an excellent absorption performance against TE waves but has an extremely poor absorption performance against TM waves and vice versa.

According to the present invention, therefore, an electromagnetic wave absorber is provided with a first dielectric material layer having two surfaces, a wave reflection layer laminated on the one surface of the first dielectric layer, a first resistive layer laminated on the other (second) surface of the first dielectric material layer, and a second dielectric material layer positioned on the first resistive layer but separated from these by an air space having a predetermined thickness to adjust its absorption characteristics for differently polarized waves.

The second dielectric material layer is arranged at an appropriate position in front of (that is in the direction of the incoming waves) the first resistive layer. The position of this second dielectric layer defines the thickness of the air space so as to adjust the phase of oblique incident waves. In a wave absorber having such structure, a characteristic impedance for TE wave differs from that for TM wave as follows; the characteristic impedance $Z_{in}$ for a TE wave is $$Z_{ch}=1/\sqrt{\epsilon_r-\sin^2\theta}\ ,$$

the characteristic impedance $Z_{in}$ for TM wave is $$Z_{ch}=\sqrt{\epsilon_r-\sin^2\theta}\ /\epsilon_r,$$

wherein $\epsilon_r$ is a dielectric constant (complex number) of the dielectric material layers. Therefore, by adjusting the phase of the oblique incident waves as aforementioned, an electromagnetic wave absorber having excellent absorption characteristics which are simultaneously effective for both the linearly polarized waves, i.e. TE and TM waves, (namely, the absorption characteristics effective for circularly polarized waves) can be obtained.

It is preferred that the absorber further includes a second resistive layer laminated on one of the two surfaces of the second dielectric layer, namely on the surface which is directed to the air space or on the opposite surface thereof. This second resistive layer is advantageous for adjusting the resistive component of the characteristic impedance so as to provide higher efficiency and broader frequency range to the wave absorber.

Further objects and advantages of the present invention will be apparent from the following description of the preferred embodiments of the invention as illustrated in the accompanying drawings.

Figure 1:
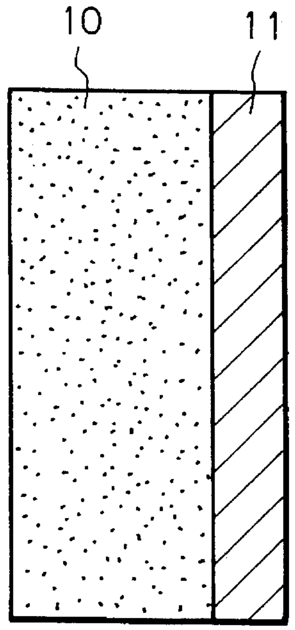
Fig. 1 PRIOR ART
FIG. 1 shows a sectional view of the already described example of the conventional thin type electromagnetic wave absorber.
Figure 2:
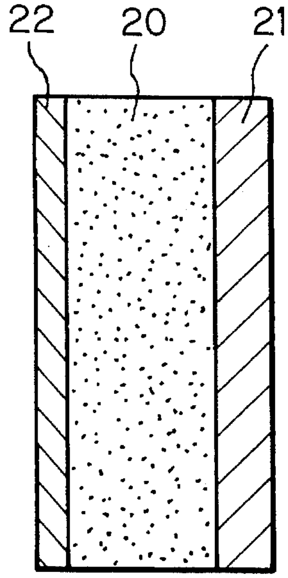
Fig. 2 PRIOR ART
FIG. 2 shows a sectional view of the already described another example of the conventional thin type electromagnetic wave absorber.
Figure 3:
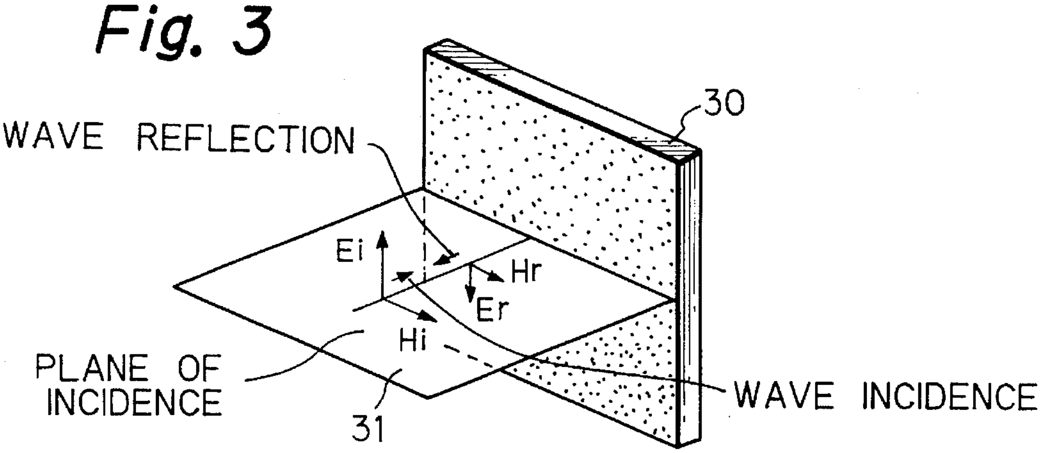
FIG. 3 illustrates directions of electric fields $E_i$ and magnetic fields $H_i$ of a perpendicularly incident electromagnetic wave.
Figure 4:
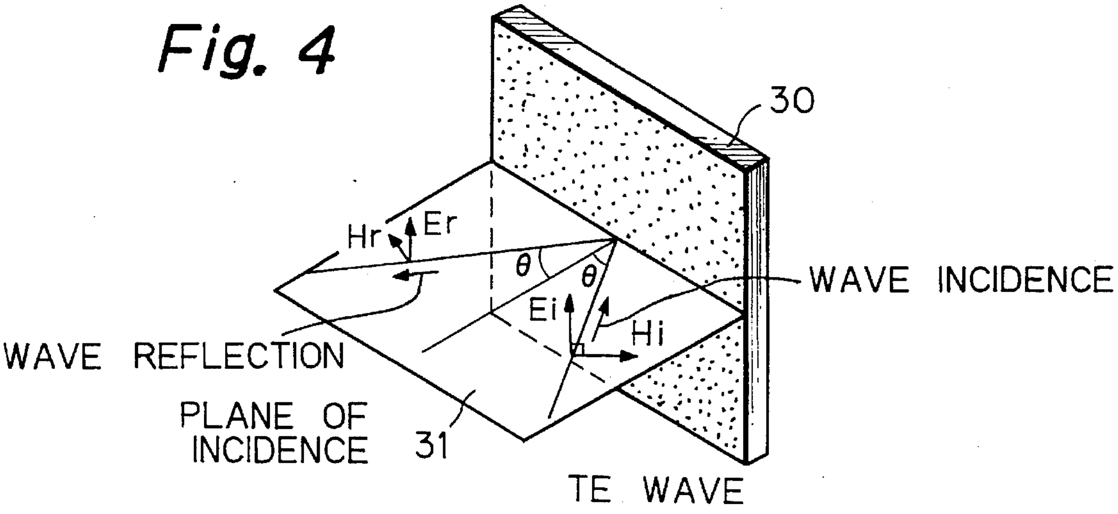
FIG. 4 illustrates directions of electric fields $E_1$ and magnetic fields $H_i$ of an oblique incident TE wave.
Figure 5:
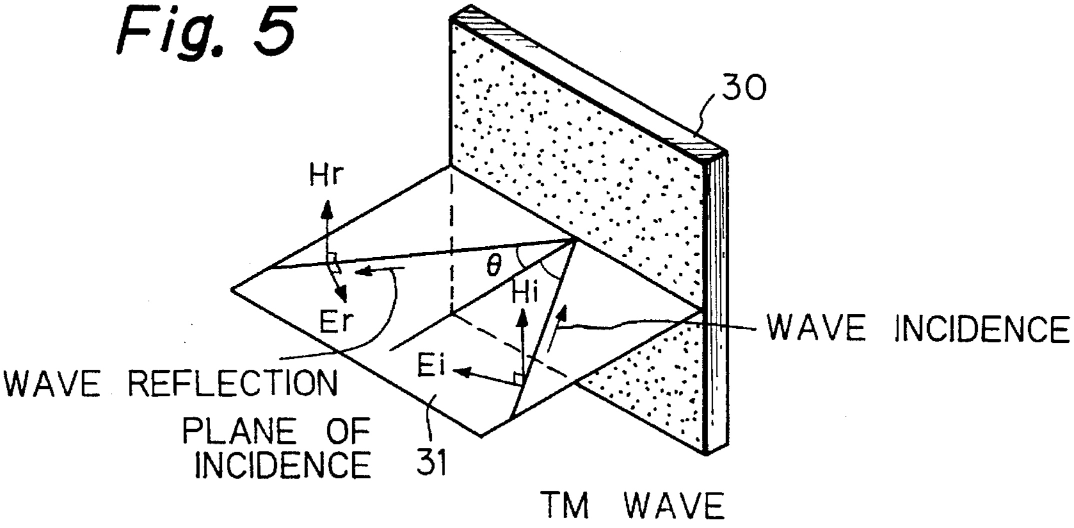
FIG. 5 illustrates directions of electric fields $E_i$ and magnetic fields $H_i$ of an oblique incident TM wave.
Figure 6A:
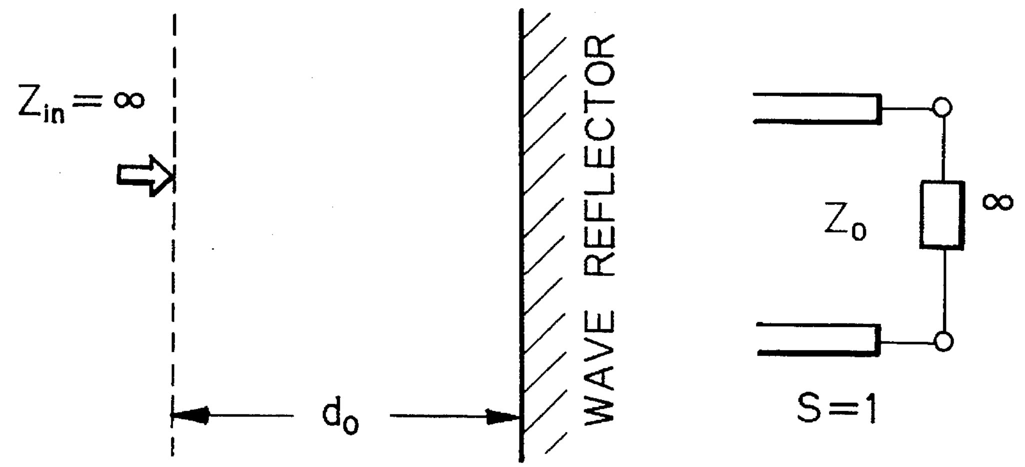
Figure 6B:
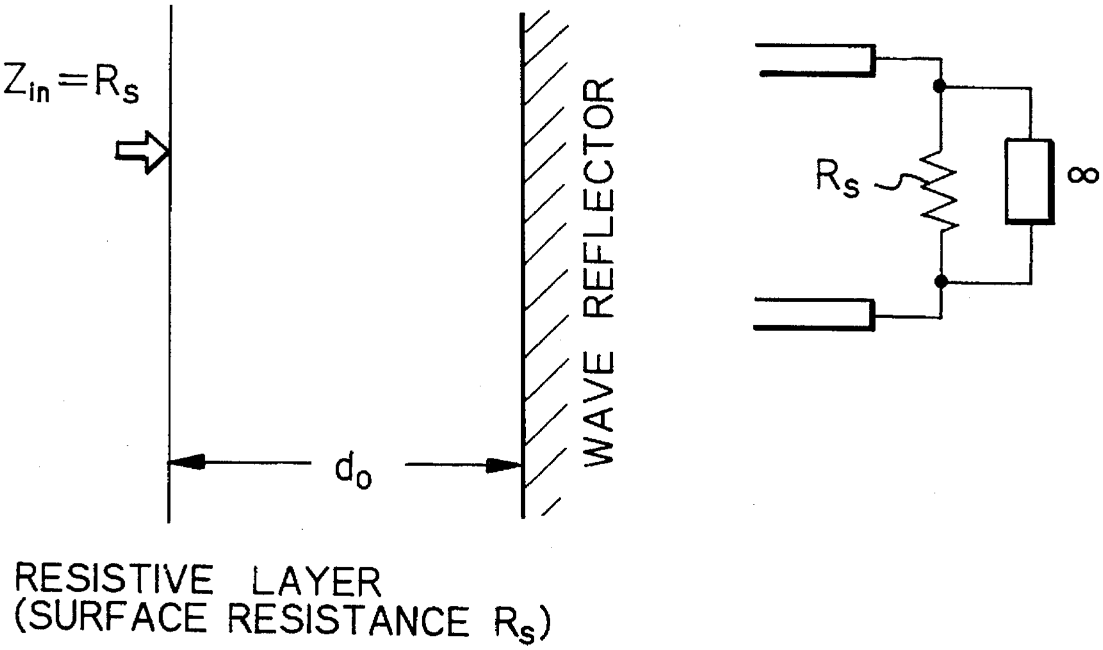
Figure 7:
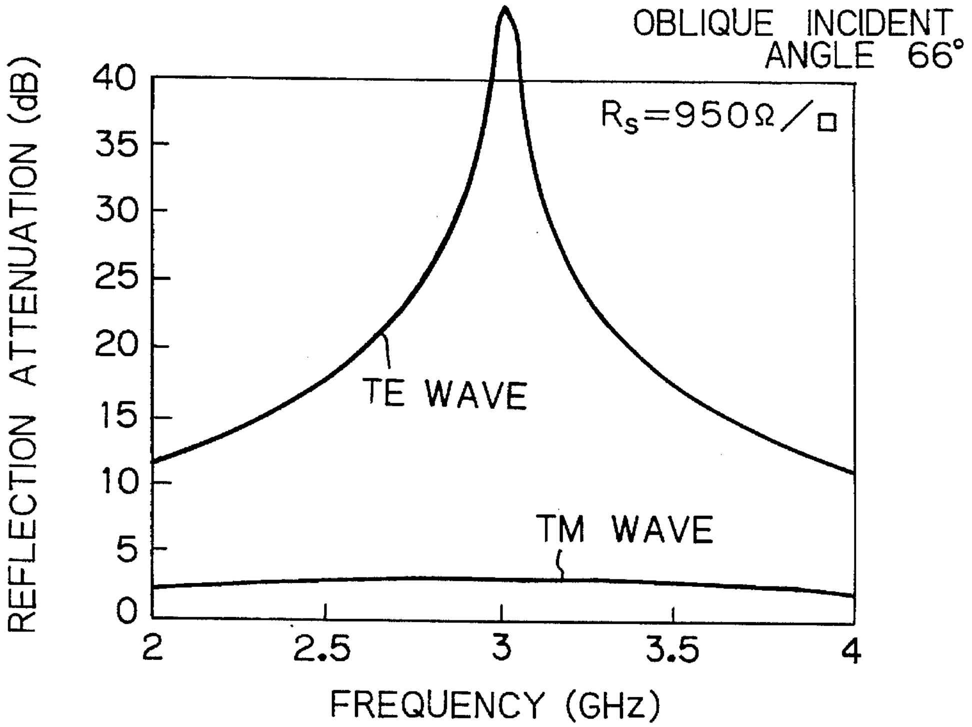
Figure 8:
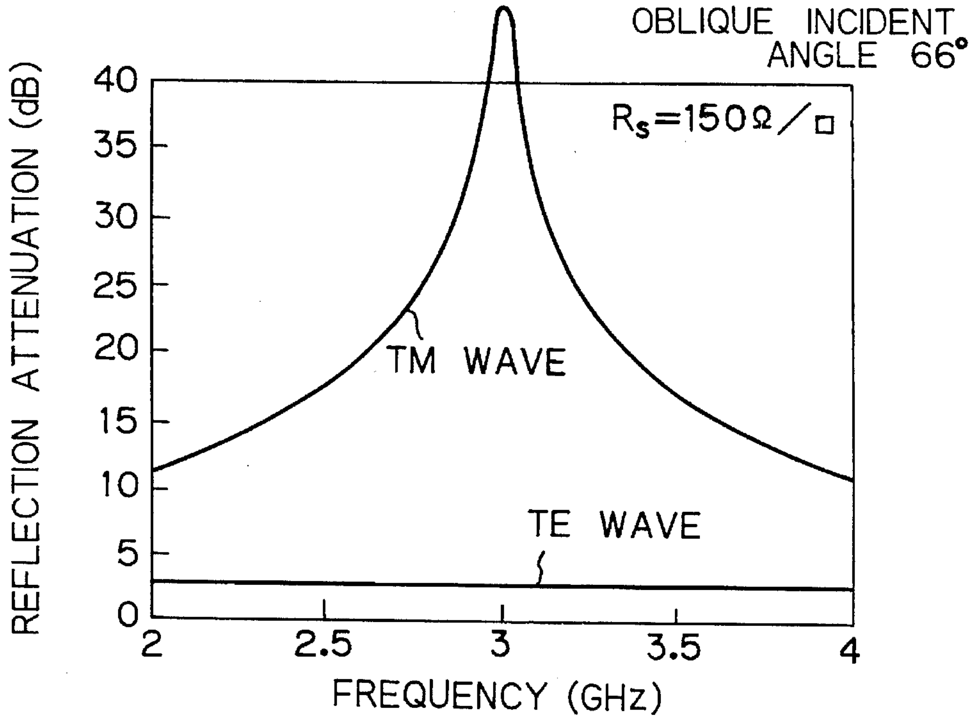
Figure 11:
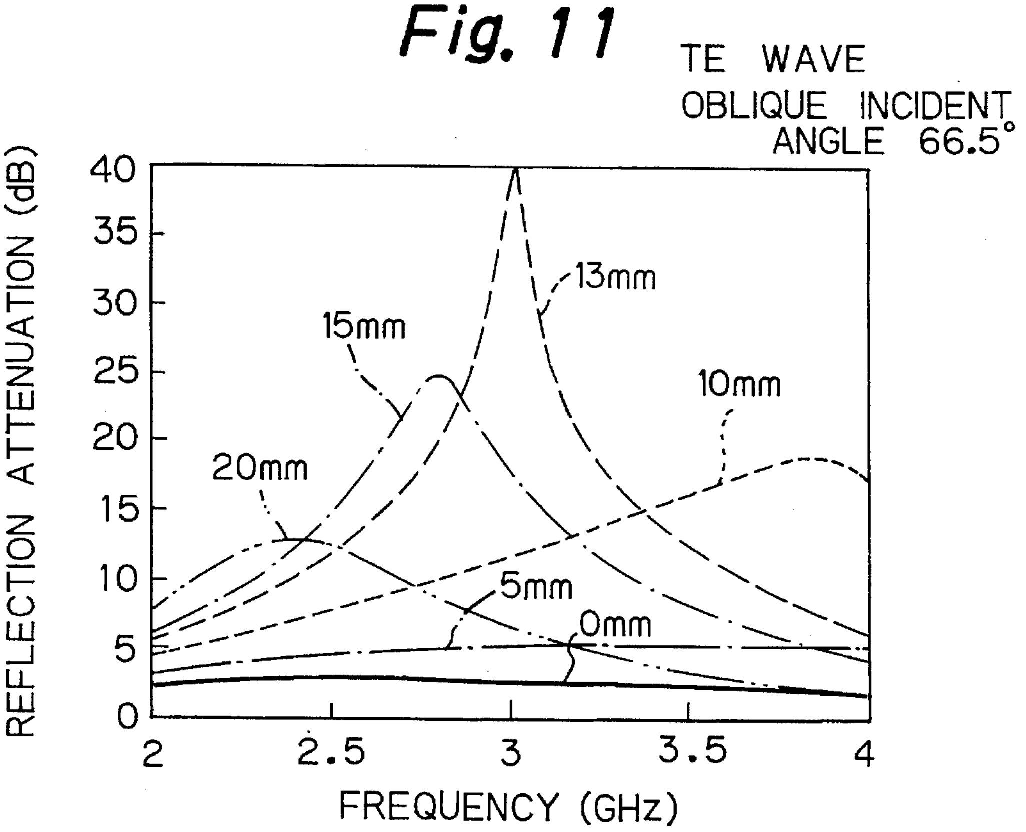
Figure 12:
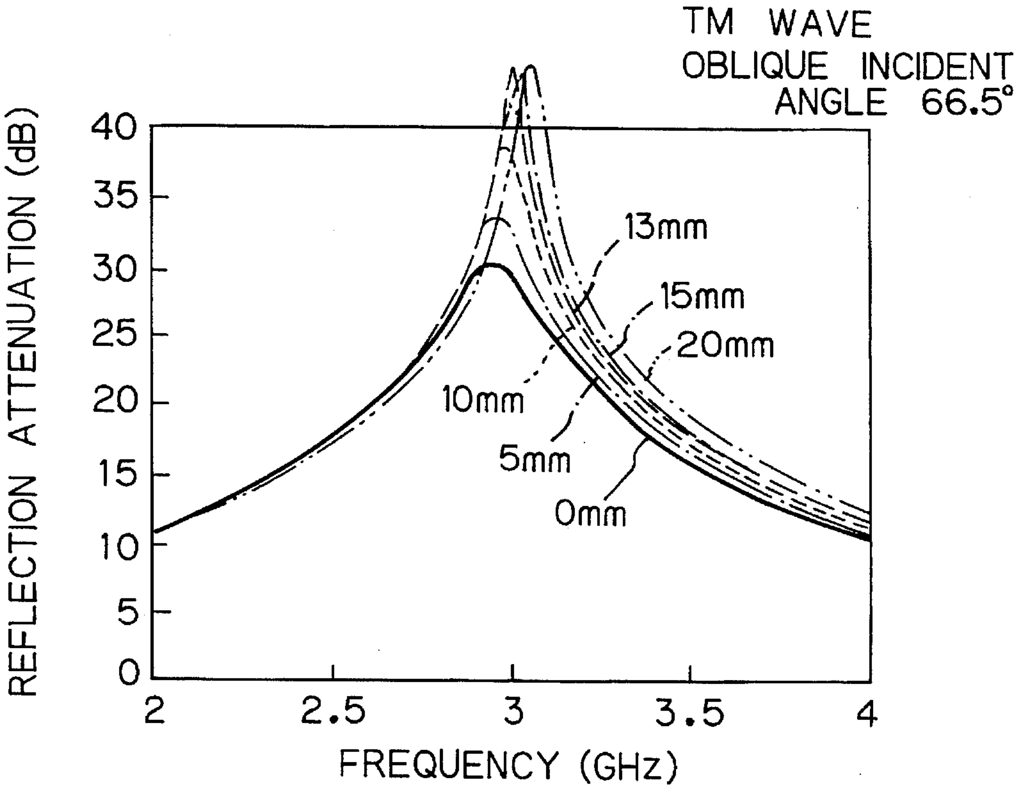
Figure 13A:
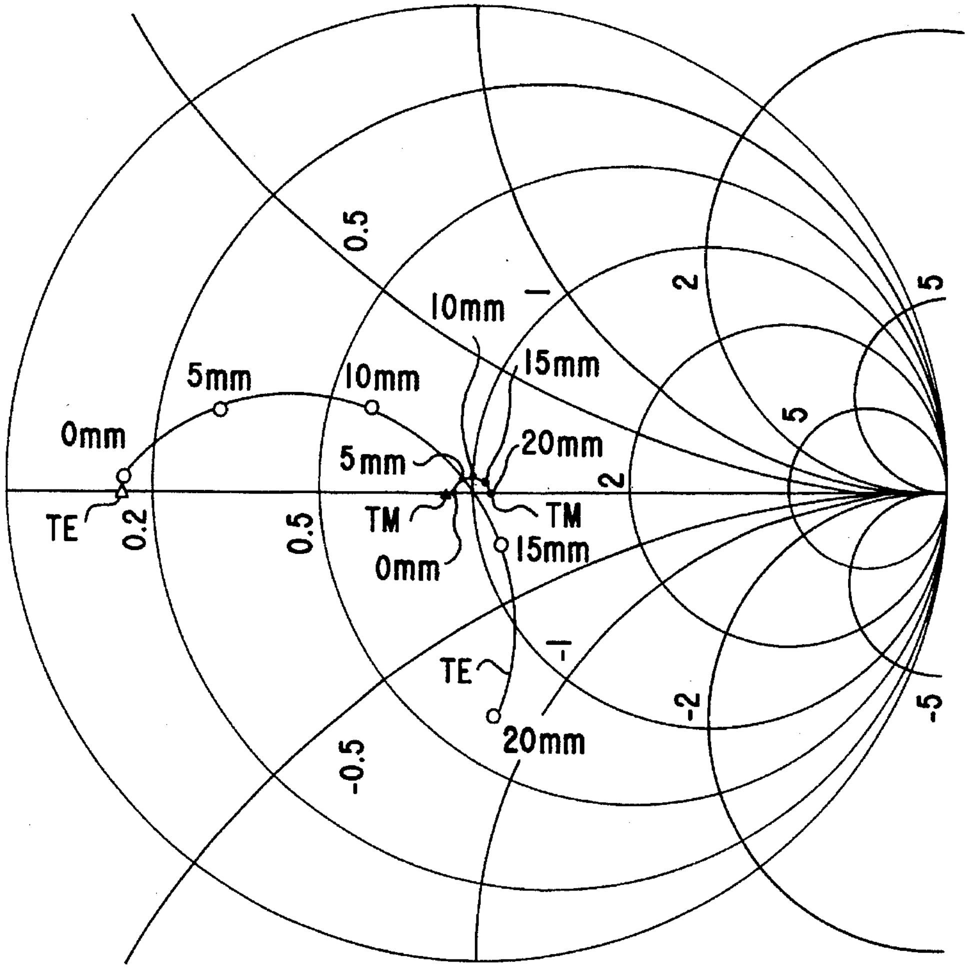

FIGS. **6*a* and 6*b*** illustrate a principle of wave absorption according to the present invention;

FIG. 7 shows reflection attenuation versus frequency characteristics of an wave absorber according to the present invention;

FIG. 8 shows reflection attenuation versus frequency characteristics of a wave absorber according to the present invention;

FIG. 9 shows an oblique view of a preferred embodiment of an electromagnetic wave absorber according to the present invention;

FIG. 10 shows a sectional view seen from an A—A line depicted in FIG. 9;

FIG. 11 illustrates wave absorption characteristics for TE waves with an oblique incident angle depending upon various thickness of the air space according to the embodiment of FIG. 9;

FIG. 12 illustrates wave absorption characteristics for TM waves with an oblique incident angle depending upon various thickness of the air space according to the embodiment of FIG. 9;

FIG. **13*a* is a Smith chart illustrating characteristic impedances for TE and TM waves according to a conventional wave absorber and an wave absorber of the embodiment of FIG. 9**;

FIG. **13*b* shows a structure of a conventional wave absorber related to the characteristic impedances shown in FIG. 13*a*;**

FIG. **13*c* shows a structure of the wave absorber of the embodiment of FIG. 9, related to the characteristic impedances shown in FIG. 13*a*;**

Figure 14:
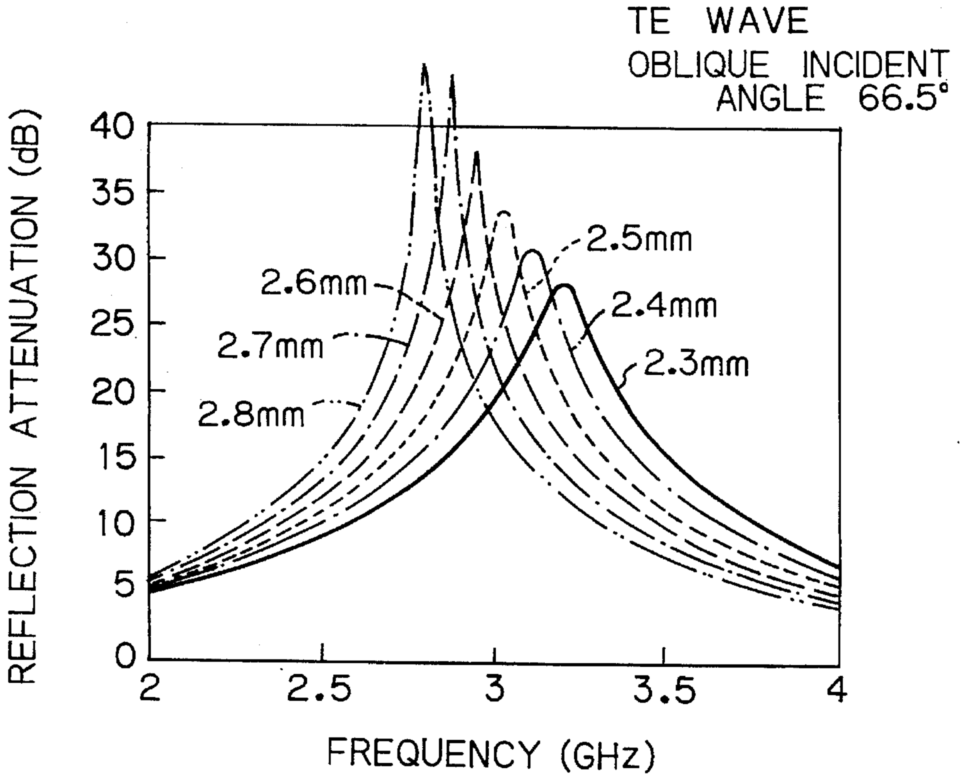
Figure 15:
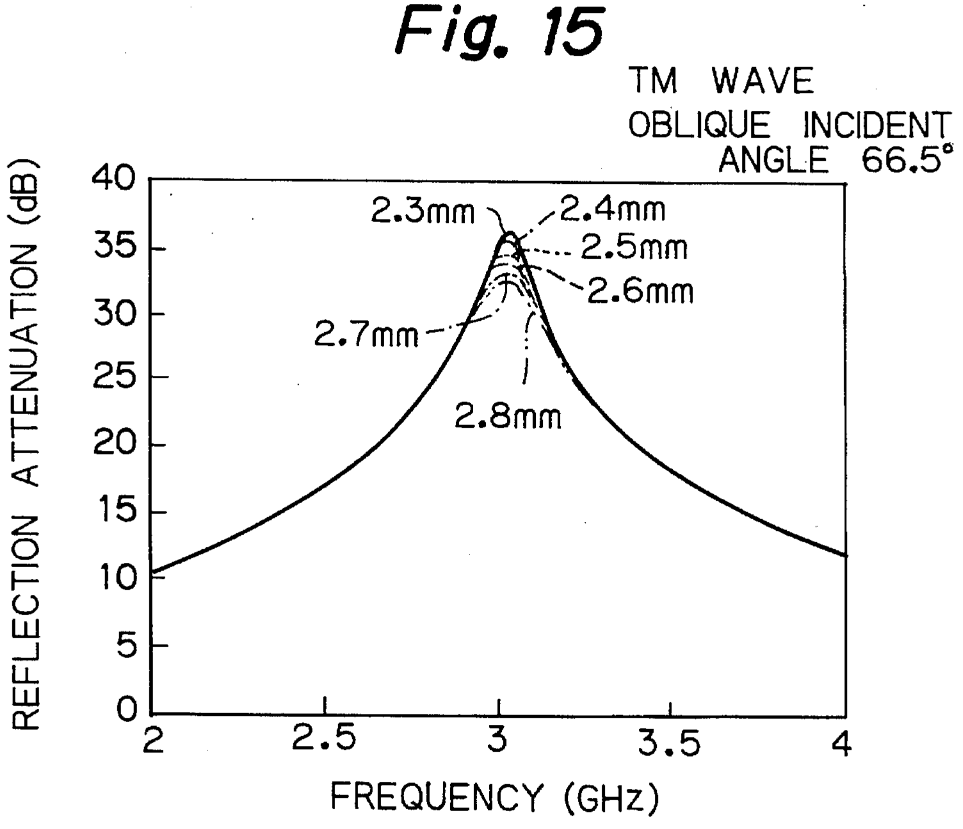
Figure 16:
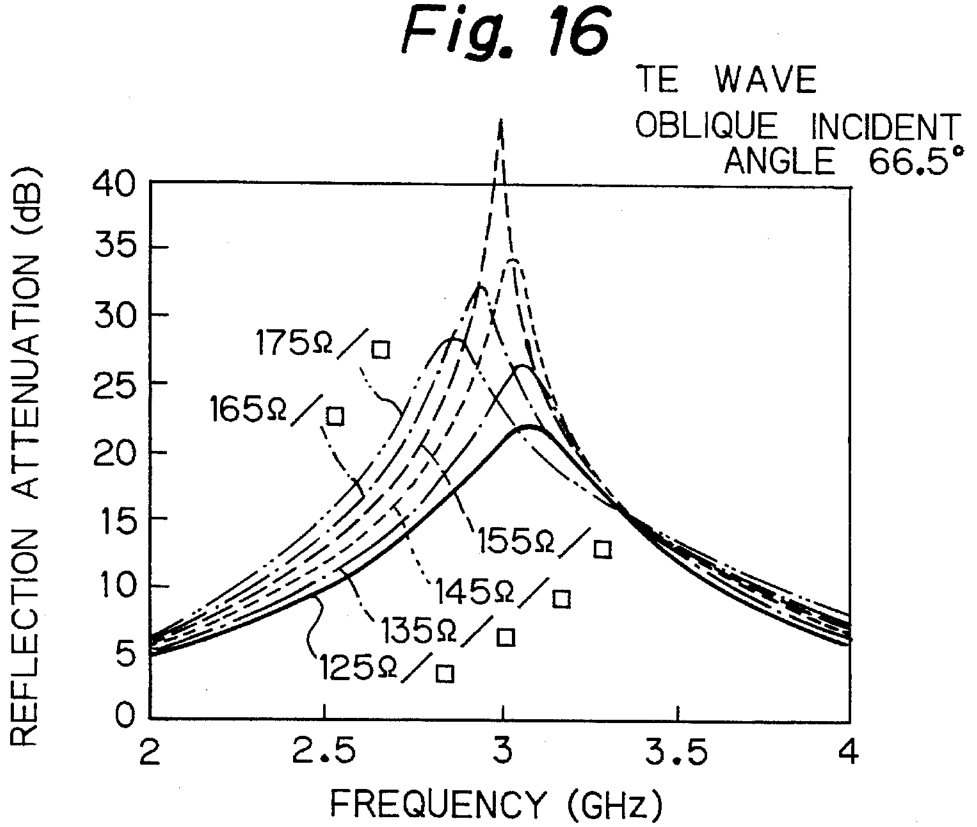
Figure 17:
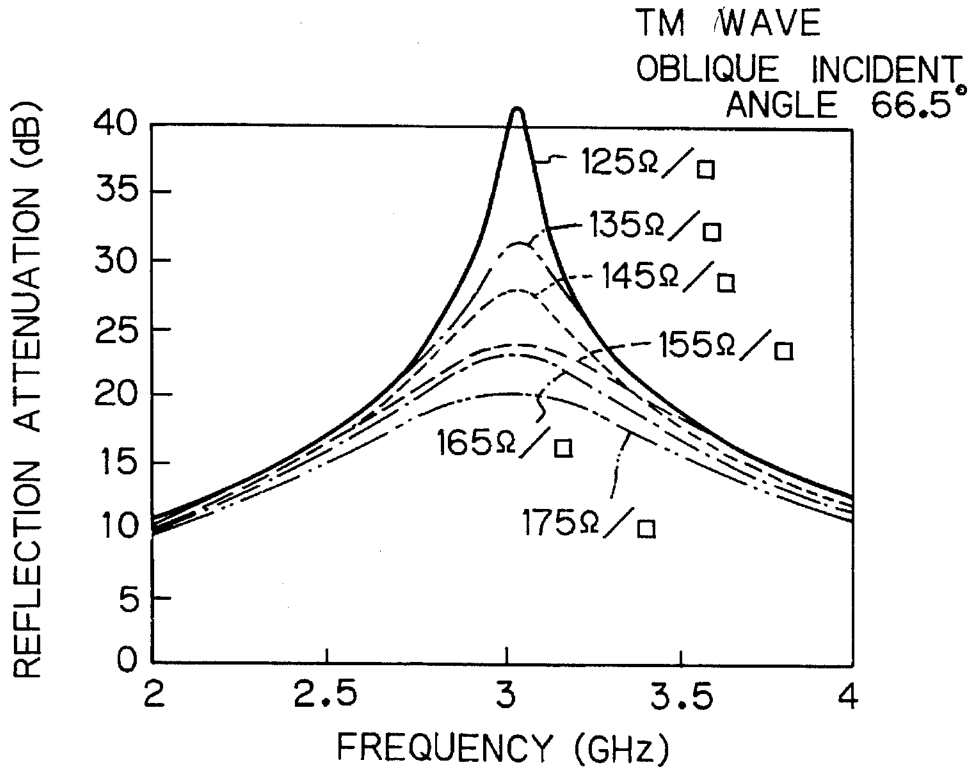
Figure 18:
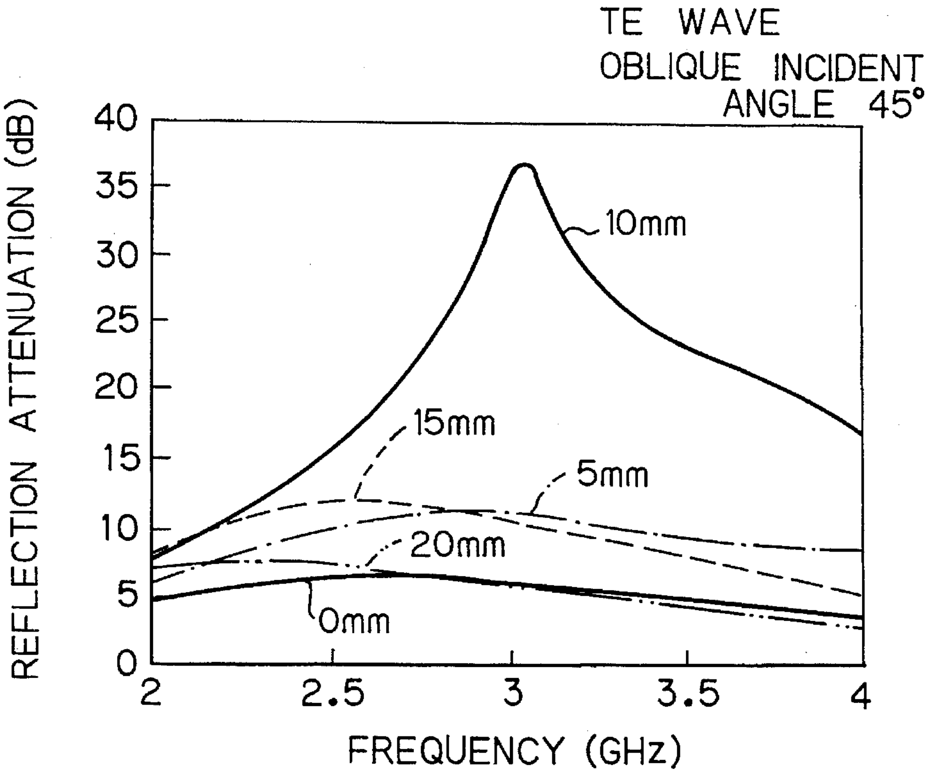
Figure 19:
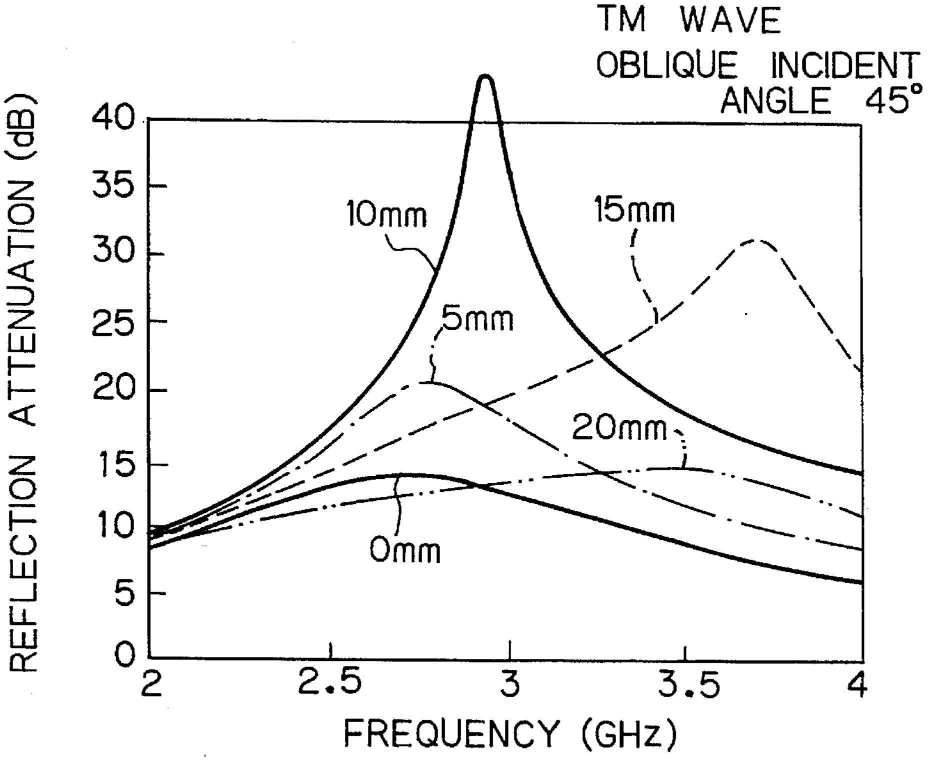
Figure 20:
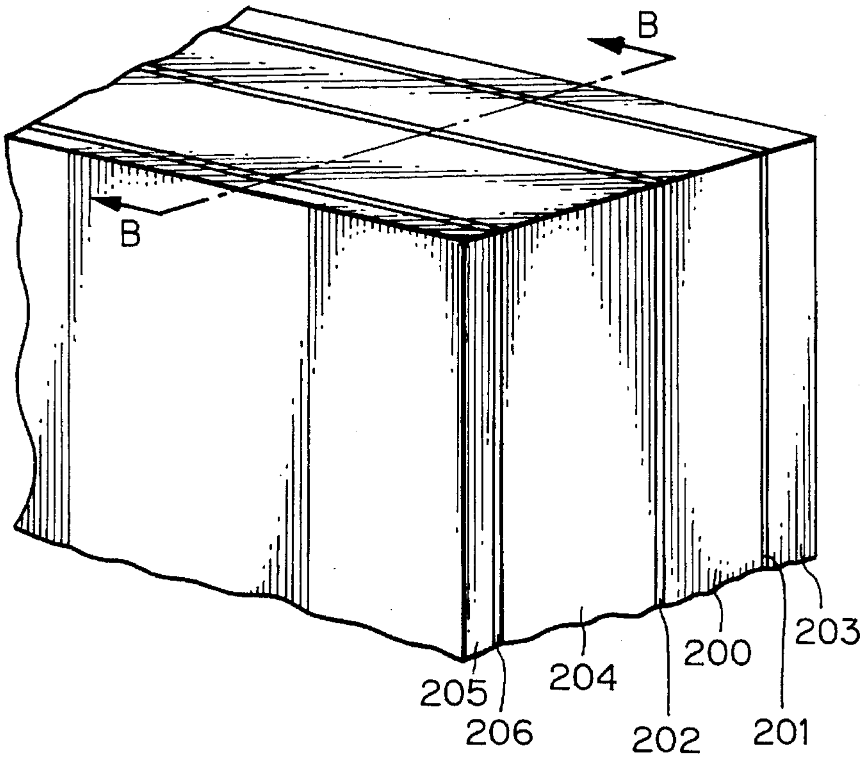
Figure 21:
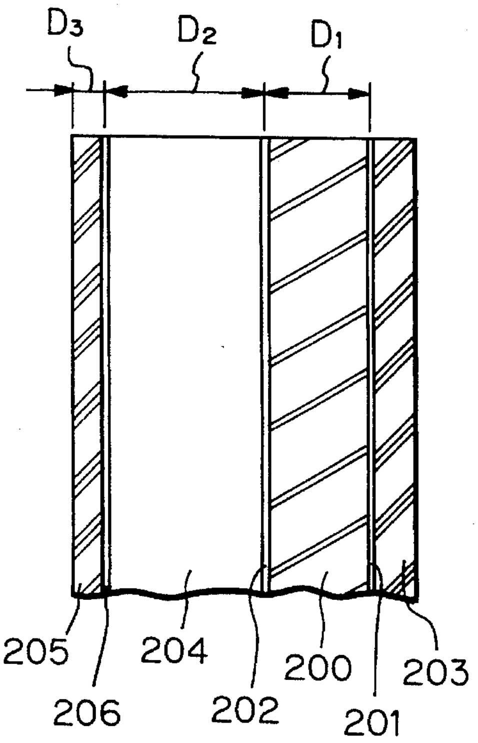
Figure 22:
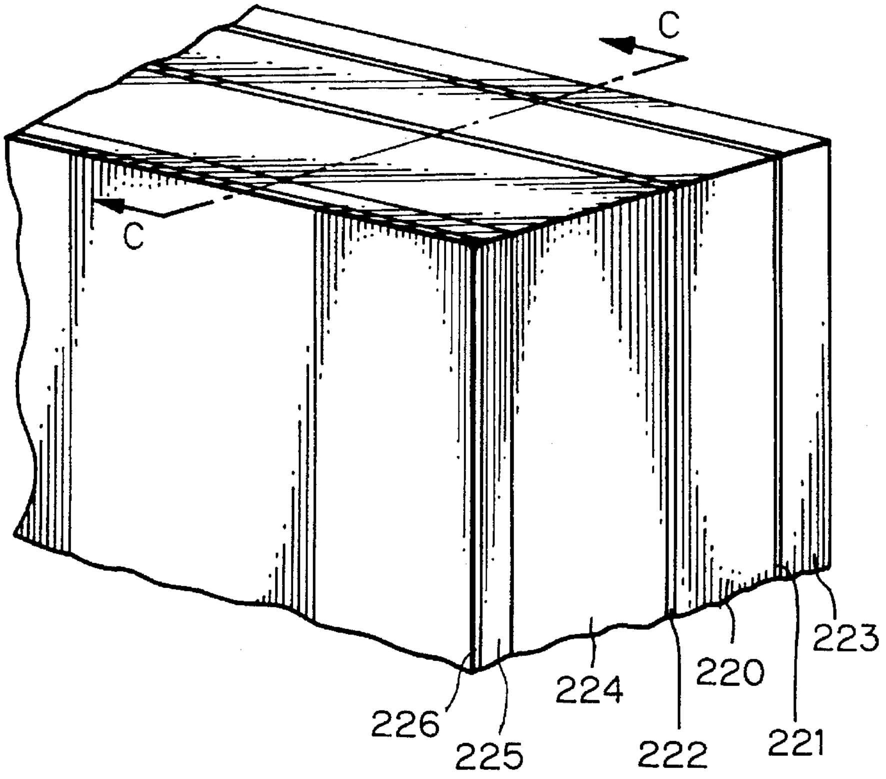
Figure 23:
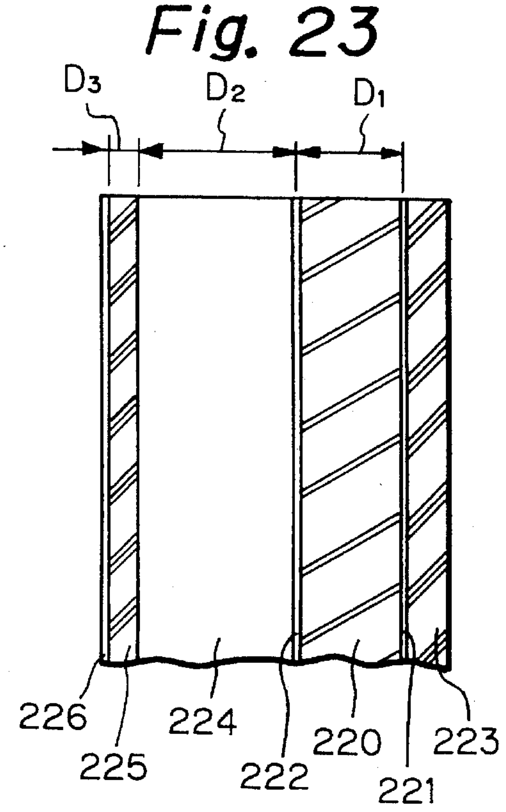

FIG. 14 illustrates wave absorption characteristics for TE waves with an oblique incident angle depending upon various thickness of the second dielectric layer according to the embodiment of FIG. 9;

FIG. 15 illustrates wave absorption characteristics for TM waves with an oblique incident angle depending upon various thickness of the second dielectric layer according to the embodiment of FIG. 9;

FIG. 16 illustrates wave absorption characteristics for TE waves with an oblique incident angle depending upon various surface resistances of the resistive layer according to the embodiment of FIG. 9;

FIG. 17 illustrates wave absorption characteristics for TM waves with an oblique incident angle depending upon various surface resistances of the resistive layer according to the embodiment of FIG. 9;

FIG. 18 illustrates wave absorption characteristics for TE waves with an oblique incident angle depending upon various thicknesses of the air space;

FIG. 19 illustrates wave absorption characteristics for TM wave with an oblique incident angle depending upon various thicknesses of the air space;

FIG. 20 shows an oblique view of an another embodiment of an electromagnetic wave absorber according to the present invention;

FIG. 21 shows a sectional view seen from an B—B line depicted in FIG. 20;

FIG. 22 shows an oblique view of a further embodiment of an electromagnetic wave absorber according to the present invention; and FIG. 23 shows a sectional view seen from an C—C line depicted in FIG. 22.

DESCRIPTION OF THE PREFERRED EMBODIMENTS

FIG. 9 shows an oblique view of a preferred embodiment of an electromagnetic wave absorber according to the present invention, and FIG. 10 shows a sectional view along the line A—A depleted in FIG. 9 looking in the direction of the arrows.

In these figures, a reference numeral 90 denotes a first dielectric material layer formed in this embodiment by a glass plate, 91 is a wave reflection layer of a thin metal layer laminated on the rear surface (with respect to a surface of the wave incidence side) of the first dielectric material layer 90 by depositing or sputtering a metal such as aluminum, nickel or copper thereon, and 92 is a resistive layer (first resistive layer), with a surface resistance of about 140 Ω/□, laminated on the front surface of the first dielectric material layer 90 by sputtering tin oxide thereon, respectively. The wave reflection layer 91 is constituted to have an electrical conductivity equal to or less than 0.1 Ω/□. On the rear surface of the reflection layer 91, a reinforcing layer 93 made of a glass plate may be attached.

The thickness $D_1$ of the first dielectric material layer 90 is determined as;

$$D_1=\lambda/4\sqrt{\epsilon_r-\sin^2\theta}$$

wherein θ is an incident angle of the incident wave to be absorbed, λ is a wave-length of the incident wave, and $\epsilon_r$ is a relative dielectric constant of this dielectric material layer 90. In this embodiment, the thickness $D_1$ of the glass plate is set to $D_1$=9.8 mm.

In front of the resistive layer 92, a second dielectric material layer 95, formed by a glass plate, is arranged. Between the resistive layer 92 and the second dielectric layer 95, there exists an air space 94. The second dielectric layer 95 serves not only as an external wall member for protecting the surface of the wave absorber but also as a member for adjusting the polarized wave characteristics by defining a thickness $D_2$ of the air space 94. A thickness $D_3$ of this second dielectric layer 95 is set, in this embodiment, to $D_3$=2.4 mm.

The wave absorber of this embodiment may have a multiglass structure constituted by integrating multi-layered glass plates, consisting of the glass plate of the reinforcing layer 93, the glass plate of the first dielectric material layer 90 with the wave reflection layer 91 and the resistive layer 92 on its respective surfaces, and the glass plate of the second dielectric material layer 95, to a single structure. Between the glasses of the first and second dielectric layers 90 and 95, the air space 94 lies.

By appropriately adjusting the thickness $D_2$ of the air space 94, the phase of the oblique incident waves can be adjusted so as to obtain absorption characteristics which are simultaneously effective for both polarized TE and TM waves. FIGS. 11 and 12 illustrate wave absorption characteristics for TE and TM waves with an oblique incident angle of 66.5°, depending upon various thicknesses $D_2$ of the air space 94 as 0 mm, 5 mm, 10 mm, 13 mm, 15 mm and 20 mm. As will be apparent from these figures, in case that the thickness $D_2$ of the air space 94 is 0 mm or 5 mm, a certain amount of the reflection attenuation can be expected for TM wave but, for TE wave, the reflection attenuation will be very low such as 5 dB or less. However, in case of $D_2$=13 mm, a reflection attenuation of about 40 dB can be obtained at the same frequency of 3 GHz for both TE and TM waves. Thus, quite excellent absorption characteristics which are simultaneously effective for both polarized TE and TM waves can be expected.

Figure 13B:
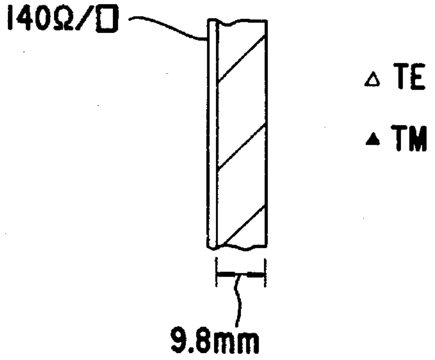
Fig.13b PRIOR ART
Figure 13C:
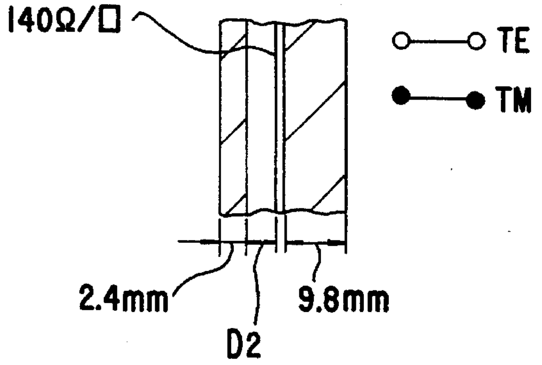

FIG. 13*a* is a Smith chart illustrating characteristic impedances for TE and TM waves according to a conventional wave absorber having a structure as shown in FIG. 13*b*, and characteristic impedances for TE and TM waves depending upon various air space's thicknesses according to an wave absorber of this embodiment having a structure as shown in FIG. 13*c*. The conventional wave absorber shown in FIG. 13*b* has a dielectric material layer of 9.8 mm thickness and a resistive layer with a surface resistance of 140 Ω/□. The wave absorber of this embodiment shown in FIG. 13*c* has a first dielectric material layer of 9.8 mm thickness, a resistive layer with a surface resistance of 140 Ω/□, an air space of various thicknesses $D_2$ and a second dielectric material layer of 2.4 mm thickness. In the chart of FIG. 13*a*, Δ and ▲ denote characteristic impedances for TE and TM waves, respectively, according to the conventional wave absorber. ○ and ● denote characteristic impedances for TE and TM waves, respectively, according to this embodiment wave absorber.

As seen from FIG. 13a, according to this embodiment, the characteristic impedance for TM wave changes a little along its resistive component depending upon the variation of the thickness $D_2$ of the air space 94. On the other hand, the characteristic impedance for TE wave greatly changes depending upon the variation of the thickness $D_2$ of the air space 94, and the characteristic impedance becomes resistive when the thickness $D_2$ is around 13 mm or higher. It should be noted that the characteristic impedances for TE and TM waves, of a conventional wave absorber, are equivalent to these of this embodiment when the thickness $D_2$ of the air space is 0 mm, respectively.

FIGS. 14 and 15 illustrate, for reference, wave absorption characteristics for TE and TM waves with an oblique incident angle of 66.5°, depending upon various thicknesses $D_3$ of the second dielectric material layer 95 according to this embodiment as 2.3 mm, 2.4 mm, 2.5 mm, 2.6 mm, 2.7 mm and 2.8 mm. In this case, the thickness $D_2$ of the air space 94 is 13.1 mm, and the surface resistance $R_s$ of the resistive layer 92 are 127.5 Ω/□ for TE wave and 147.5 Ω/□ for TM wave.

FIGS. 16 and 17 illustrate, for reference, wave absorption characteristics for TE and TM waves with an oblique incident angle of 66.5°, depending upon various surface resistances $R_s$ of the resistive layer 92 according to this embodiment as 125 Ω/□, 135 Ω/□, 145 Ω/□, 155 Ω/□, 165 Ω/□ and 175 Ω/□. In this case, the thickness $D_1$ of the first dielectric material layer 90 is 9.8 mm, and the thickness $D_2$ of the air space 94 is 14 mm.

FIGS. 18 and 19 illustrate wave absorption characteristics for TE and TM waves with an oblique incident angle of 45°, depending upon various thicknesses $D_2$ of the air space 94 as 0 mm, 5 mm, 10 mm, 15 mm and 20 mm. In this case, the structure of the wave absorber is the same as that of the embodiment of FIGS. 9 and 10, the thickness $D_1$ of a glass plate which constitutes the first dielectric material layer 90 is 9.3 mm, the surface resistance $R_s$ of the resistive layer 92 is about 170 Ω/□ , and the thickness $D_3$ of a glass plate which constitutes the second dielectric material layer 95 is 2.3 mm. As will be apparent from these figures, in case of $D_2$=10 mm, the reflection attenuation of 35 dB or more can be obtained at the same frequency of 3 GHz for both TE and TM waves. Namely, quite excellent absorption characteristics which are simultaneously effective for both polarized TE and TM waves can be achieved.

As for the dielectric material layers 90 and 95, any one of following various dielectric materials other than the aforementioned glass may be used in a form of plate:

(1) foamed material such as polyethylene, polystyrene, polyurethane or silicon;

(2) organic resin such as polyvinyl chloride, acrylate resin, polycarbonate or polytetra-fluoroethylene Teflon (Registered trade mark);

(3) wood;

(4) ceramics;

(5) rubber; and (6) paper.

The wave reflection layer 91 may be made of any one of following various materials other than the aforementioned thin metal film:

(1) metal plate made of aluminum, iron, copper or stainless steal;

(2) metal foil made of copper, aluminum or iron;

(3) metal wires in a form of grid;

(4) carbon woven fabric;

(5) metal plated fabric; and (6) metal woven fabric made of stainless steal.

As for forming the resistive layer 92, any one of following various processes and materials other than the aforementioned process of sputtering tin oxide may be used:

(1) depositing or spreading metal oxide thin film such as indium-tin oxide (ITO) or zinc oxide;

(2) depositing or spreading metal nitride thin film such as titanium nitride; and (3) printing conductive coating material made by mixing carbon with resin.

FIG. 20 shows an oblique view of an another embodiment of an electromagnetic wave absorber according to the present invention, and FIG. 21 shows a sectional view taken along the line looking in the direction of the arrows depicted in FIG. 20.

In these figures, a reference numeral 200 denotes a first dielectric material layer formed by in this embodiment a glass plate, 201 an wave reflection layer of a thin metal layer laminated on the rear surface (with respect to a surface of wave incidence side) of the first dielectric material layer 200 by depositing or sputtering a metal such as aluminum, nickel or copper thereon, and 202 a first resistive layer with a surface resistance of about 140 Ω/□, laminated on the front surface of the first dielectric material layer 200 by sputtering tin oxide thereon, respectively. The wave reflection layer 201 is constituted to have an electrical conductivity equal to or less than 0.1 Ω/□. On the rear surface of the reflection layer 201, a reinforcing layer 203 made of a glass plate may be attached.

An thickness $D_1$ of the first dielectric material layer 200 is determined as;

$$D_1=\lambda/4\sqrt{\epsilon_r-\sin^2\theta}$$

wherein θ is an incident angle of the incident wave to be absorbed, λ is a wave-length of the incident wave, and $\epsilon_r$ is a relative dielectric constant of this dielectric material layer 200. In this embodiment, the thickness $D_1$ of the glass plate is set to $D_1$=9.8 mm.

In front of the first resistive layer 202, a second dielectric material layer 205 formed by a glass plate is arranged. On the rear surface of the second dielectric material layer 205, a second resistive layer 206 is laminated by sputtering for example tin oxide. Between the first and second resistive layers 202 and 206, there exists an air space 204. The second dielectric layer 205 serves not only as an external wall member for protecting the surface of the wave absorber but also as a member for adjusting the polarized wave characteristics by defining the thickness $D_2$ of the air space 204. A thickness $D_3$ of this second dielectric layer 205 is set, in this embodiment, to $D_3$=2.4 mm. The second resistive layer 206 serves to adjust the resistance component of the characteristic impedance so as to provide higher efficiency and broader frequency range to the wave absorber.

The wave absorber of this embodiment may have a multiglass structure constituted by integrating multi-layered glass plates, consisting of the glass plate of the reinforcing layer 203, the glass plate of the first dielectric material layer 200 with the wave reflection layer 201 and the first resistive layer 202 on its respective surfaces, and the glass plate of the second dielectric material layer 205 with the second resistive layer 206 on its rear surface, into a single structure. Between the glasses of the first and second dielectric layers 200 and 205, the air space 204 lies.

Similar to the embodiment of FIGS. 9 and 10, by appropriately adjusting the thickness $D_2$ of the air space 204, the phase of the oblique incident waves can be adjusted so as to obtain absorption characteristics which are simultaneously effective for both polarized TE and TM waves. According to this embodiment, furthermore, by adjusting the resistance value of the second resistive layer 206, higher efficiency and broader frequency range can be obtained.

As for the dielectric material layers 200 and 205, any one of following various dielectric materials other than the aforementioned glass may be used in the form of plate:

(1) foamed material such as polyethylene, polystyrene, polyurethane or silicon;

(2) organic resin such as polyvinyl chloride, acrylate resin, polycarbonate or polytetra-fluoroethylene Teflon (Registered trade mark);

(3) wood;

(4) ceramics;

(5) rubber; and (6) paper.

The wave reflection layer 201 may be made of any one of following various materials other than the aforementioned thin metal film:

(1) metal plate made of aluminum, iron, copper or stainless steal;

(2) metal foil made of copper, aluminum or iron;

(3) metal wires in a form of grid;

(4) carbon woven fabric;

(5) metal plated fabric; and (6) metal woven fabric made of stainless steal.

The resistive layers 202 and 206 may be formed by any one of following various processes and materials other than the aforementioned process of sputtering tin oxide may be used:

(1) depositing or spreading metal oxide thin film such as indium-tin oxide (ITO) or zinc oxide;

(2) depositing or spreading metal nitride thin film such as titanium nitride; and (3) printing conductive coating material made by mixing carbon with resin.

FIG. 22 shows an oblique view of a further embodiment of an electromagnetic wave absorber according to the present invention, and FIG. 23 shows a sectional view taken along the line looking in the direction of the arrows in FIG. 22.

In these figures, a reference numeral 220 denotes a first dielectric material layer formed by in this embodiment a glass plate, 221 is a wave reflection layer of a thin metal layer laminated on the rear surface (with respect to a surface of wave incidence side) of the first dielectric material layer 220 by depositing or by sputtering a metal such as aluminum, nickel or copper, and 222 is a first resistive layer with a surface resistance of about 140 Ω/□, laminated on the front surface of the first dielectric material layer 220 by sputtering tin oxide, respectively. The wave reflection layer 221 is constituted to have an electrical conductivity equal to or less than 0.1 Ω/□. On the rear surface of the reflection layer 201, a reinforcing layer 223 made of a glass plate is attached.

An thickness $D_1$ of the first dielectric material layer 220 is determined as;

$$D_1 = \lambda/4\sqrt{\epsilon_r - \sin^2\theta}$$

wherein θ is an incident angle of the incident wave to be absorbed, λ is a wave-length of the incident wave, and $\epsilon_r$ is a relative dielectric constant of this dielectric material layer 220. In this embodiment, the thickness $D_1$ of the glass plate is set to $D_1$=9.8 mm.

In front of the first resistive layer 222, a second dielectric material layer 225 formed by a glass plate is arranged. On the front surface of the second dielectric material layer 225, a second resistive layer 226 is laminated by sputtering for example tin oxide. Between the first resistive layer 222 and the second dielectric layer 225, there exists an air space 224. The second dielectric layer 225 serves not only as an external wall member for protecting the surface of the wave absorber but also as a member for adjusting the polarized wave characteristics by defining the thickness $D_2$ of the air space 224. A thickness $D_3$ of this second dielectric layer 225 is set, in this embodiment, to $D_3$=2.4 mm. The second resistive layer 226 serves to adjust the resistance component of the characteristic impedance so as to provide higher efficiency and broader frequency range to the wave absorber.

The wave absorber of this embodiment may have a multiglass structure constituted by integrating multi-layered glass plates, consisting of the glass plate of the reinforcing layer 223, the glass plate of the first dielectric material layer 220 with the wave reflection layer 221 and the first resistive layer 222 on its respective surfaces, and the glass plate of the second dielectric material layer 225 with the second resistive layer 226 on its front surface, into a single structure. Between the glasses of the first and second dielectric layers 220 and 225, the air space 224 lies.

Similar to the embodiment of FIGS. 9 and 10, by appropriately adjusting the thickness $D_2$ of the air space 224, the phase of the oblique incident waves can be adjusted so as to obtain absorption characteristics which are simultaneously effective for both polarized TE and TM waves. According to this embodiment, furthermore, by adjusting the resistance value of the second resistive layer 226, higher efficiency and broader frequency range can be obtained.

As for the dielectric material layers 220 and 225, any one of following various dielectric materials other than the aforementioned glass may be used in a form of plate:

(1) foamed material such as polyethylene, polystyrene, polyurethane or silicon;

(2) organic resin such as polyvinyl chloride, acrylate resin, polycarbonate or polytetra-fluoroethylene Teflon (Registered trade mark);

(3) wood;

(4) ceramics;

(5) rubber; and (6) paper.

The wave reflection layer 221 may be made of any one of following various materials other than the aforementioned thin metal film:

(1) metal plate made of aluminum, iron, copper or stainless steal;

(2) metal foil made of copper, aluminum or iron;

(3) metal wires in a form of grid;

(4) carbon woven fabric;

(5) metal plated fabric; and (6) metal woven fabric made of stainless steal.

The resistive layers 222 and 226 may be formed by any one of following various processes and materials other than the aforementioned process of sputtering tin oxide may be used:

(1) depositing or spreading metal oxide thin film such as indium-tin oxide (ITO) or zinc oxide;

(2) depositing or spreading metal nitride thin film such as titanium nitride; and (3) printing conductive coating material made by mixing carbon with resin.

In the embodiment of FIG. 22 and 23, a coating for protecting the second resistive layer 226 may be formed on the front surface of this resistive layer 226. This coating may be made of material with an excellent durability as any one of following materials:

(1) film or coating material made of polyurethane, fluorine or silicon organic resin;

(2) glass;

(3) ceramics; and (4) rubber.

As mentioned above, the electromagnetic wave absorber according to the present invention has excellent absorption characteristics which are simultaneously effective for both linearly polarized TE and TM waves, and for circularly polarized waves and thus can effectively suppress any reflections caused by oblique wave incidence with no polarization dependency. Also the wave absorber according to the present invention can be easily designed and manufactured.

Many widely different embodiments of the present invention may be constructed without departing from the spirit and scope of the present invention. It should be understood that the present invention is not limited to the specific embodiments described in the specification, except as defined in the appended claims.

What is claimed is:

1. An electromagnetic wave absorber comprising:

a first dielectric material layer having a first surface and a second surface opposite to said first surface;

a wave reflection layer laminated on said first surface of said first dielectric material layer;

a first resistive layer laminated on said second surface of said first dielectric material layer;

a second dielectric material layer disposed proximate to said first resistive layer on a side thereof opposite to said first dielectric material; and an air space, having a thickness sufficient to adjust absorption characteristics of said wave absorber for differently polarized waves, disposed between said first resistive layer and said second dielectric material layer.

2. An electromagnetic wave absorber as claimed in claim 1, wherein said second dielectric material layer has two opposite surfaces, and wherein said absorber further comprises a second resistive layer laminated on one of said opposite surfaces of said second dielectric layer.

3. An electromagnetic wave absorber as claimed in claim 2, wherein said second resistive layer is laminated on a surface of said second dielectric material layer facing on said air space.

4. An electromagnetic wave absorber as claimed in claim 2, wherein said second resistive layer is laminated on a surface of said second dielectric material layer which is opposite to said air space.

5. An electromagnetic wave absorber as claimed in claim 1 wherein said first resistive layer and said second dielectric material layer are substantially completely separated by said air gap.

* * * * *